United States Patent
Chern et al.

(10) Patent No.: US 11,322,500 B2
(45) Date of Patent: May 3, 2022

(54) STACKED CAPACITOR WITH HORIZONTAL AND VERTICAL FIN STRUCTURES AND METHOD FOR MAKING THE SAME

(71) Applicant: HeFeChip Corporation Limited, Sai Ying Pun (HK)

(72) Inventors: Geeng-Chuan Chern, Cupertino, CA (US); Liang-Choo Hsia, Hsinchu (TW)

(73) Assignee: HeFeChip Corporation Limited, Sai Ying Pun (HK)

( * ) Notice: Subject to any disclaimer, the term of this patent is extended or adjusted under 35 U.S.C. 154(b) by 99 days.

(21) Appl. No.: 16/941,490

(22) Filed: Jul. 28, 2020

(65) Prior Publication Data
US 2022/0037332 A1  Feb. 3, 2022

(51) Int. Cl.
*H01L 27/108* (2006.01)
*H01L 21/311* (2006.01)

(52) U.S. Cl.
CPC .. *H01L 27/10852* (2013.01); *H01L 27/10814* (2013.01); *H01L 21/31111* (2013.01)

(58) Field of Classification Search
CPC ......... H01L 27/10852; H01L 27/10814; H01L 21/31111; H01L 28/87; H01L 28/91
See application file for complete search history.

(56) References Cited

U.S. PATENT DOCUMENTS

| | | |
|---|---|---|
| 5,006,481 A | 4/1991 | Chan |
| 5,126,916 A | 6/1992 | Tseng |
| 5,290,726 A | 3/1994 | Kim |
| 5,851,897 A | 12/1998 | Wu |
| 5,903,024 A | 5/1999 | Hsu |
| 6,008,515 A | 12/1999 | Hsia |
| 6,064,085 A | 5/2000 | Wu |
| 6,100,129 A * | 8/2000 | Tu .......................... H01L 28/82 438/398 |

(Continued)

FOREIGN PATENT DOCUMENTS

KR   20120089580 A  *  8/2012  ............. H01L 21/84

OTHER PUBLICATIONS

Rui Martins, "7.2.2 Stacked Capacitor DRAM Cell", Dissertation, On the Design of Very Low Power Integrated Circuits, eingereicht an derTechnischen Universität Wien Fakultät fur Elektrotechnik, Feb. 4, 1999.

*Primary Examiner* — Edward Chin
(74) *Attorney, Agent, or Firm* — Winston Hsu

(57) ABSTRACT

A stacked capacitor includes a substrate having a first ILD layer thereon and a source conductive plate in the first ILD layer; a second ILD layer disposed on the first ILD layer; and a stacked capacitor area in the second ILD layer. The stacked capacitor area partially exposes the source conductive plate. A fin-shaped structure is disposed on the source conductive plate within the stacked capacitor area. The fin-shaped structure includes horizontal fins and vertical fins. A widened central hole penetrates through the fin-shaped structure and partially exposes the source conductive plate. A first conductive layer is disposed on the fin-shaped structure and the source conductive plate in the widened central hole. A capacitor dielectric layer is disposed on the first conductive layer. A second conductive layer is disposed on the capacitor dielectric layer.

19 Claims, 8 Drawing Sheets

(56) References Cited

U.S. PATENT DOCUMENTS

| | | | | |
|---|---|---|---|---|
| 6,130,128 | A * | 10/2000 | Lin | H01L 28/91 |
| | | | | 438/254 |
| 6,303,430 | B1 * | 10/2001 | Jenq | H01L 28/91 |
| | | | | 438/254 |
| 6,448,597 | B1 | 9/2002 | Kasai | |
| 7,276,751 | B2 | 10/2007 | Ho | |
| 7,682,896 | B2 | 3/2010 | Ho | |
| 10,818,763 | B1 * | 10/2020 | Stamper | H01L 21/823437 |
| 2003/0042519 | A1 | 3/2003 | Tzeng | |
| 2009/0236691 | A1 | 9/2009 | Dyer | |
| 2011/0073994 | A1 | 3/2011 | Liu | |
| 2018/0047582 | A1 * | 2/2018 | Lemke | B81C 1/00928 |
| 2019/0181830 | A1 * | 6/2019 | Xu | H03H 9/02228 |

* cited by examiner

STACKED CAPACITOR WITH HORIZONTAL AND VERTICAL FIN STRUCTURES AND METHOD FOR MAKING THE SAME

BACKGROUND OF THE INVENTION

1. Field of the Invention

The present disclosure relates generally to the field of semiconductor technology. More particularly, the present disclosure relates to a stacked capacitor with horizontal and vertical fin structures and a method for fabricating the same.

2. Description of the Prior Art

It is known that semiconductor dynamic random access memory (DRAM) requires a capacitor with high capacitance value. There are two types of capacitor: stacked capacitors and trenched capacitors. As the geometry of the semiconductor technology becomes smaller and smaller, the trenched capacitor that requires a deep trench with very high aspect ratio results in significant processing difficulties. The stacked capacitor has the advantage that it usually requires relatively smaller aspect ratio, compared to a deep trench for the trenched capacitor.

Further, it is always desirable to increase the capacitance per unit area for compensating area loss due to dimension reduction of unit DRAM cells. Therefore, there is a need in this technical field to provide an improved semiconductor memory device having a stacked capacitor with increased capacitor surface area for DRAM applications.

SUMMARY OF THE INVENTION

It is one objective of the present disclosure to provide a structure, as well as method of fabricating same, of a stacked capacitor with increased capacitor surface area and capacitance.

One aspect of the present disclosure provides a method for fabricating a stacked capacitor is disclosed. A substrate is provided. The substrate has a first interlayer dielectric (ILD) layer thereon and at least one source conductive plate in the first ILD layer. A second ILD layer is deposited on the first ILD layer. At least one stacked capacitor area is formed in the second ILD layer. A film stack comprising alternating first layers and second layers is formed on the second ILD layer and an interior surface of the stacked capacitor area. A planarization process is performed to planarize the film stack such that a top surface of the second ILD layer is exposed. A through hole is formed in the film stack. The through hole partially exposes the source conductive plate. An isotropic etching process is performed to selectively etch the first layers of the film stack via the through hole and the second ILD layer, thereby forming a widened central hole and a fin-shaped structure in the second ILD layer. The fin-shaped structure comprises horizontal fins and vertical fins. A first conductive layer is formed on the fin-shaped structure. A capacitor dielectric layer is formed on the first conductive layer. A second conductive layer is formed on the capacitor dielectric layer.

According to some embodiments, the stacked capacitor area at least partially exposes a top surface of the source conductive plate.

According to some embodiments, the first layers and second layers are nonconductive dielectric layers.

According to some embodiments, the first layers comprise silicon oxide layers and the second layers comprise silicon nitride layers.

According to some embodiments, each of the silicon oxide layers has a thickness of about 2-20 nm.

According to some embodiments, each of the silicon nitride layers has a thickness of about 2-20 nm.

According to some embodiments, the film stack comprises a recessed region within the stacked capacitor area.

According to some embodiments, the method further comprises: forming a sacrificial layer over the film stack to fill the recessed region.

According to some embodiments, sacrificial layer comprises a photoresist, an organic planarization layer (OPL) or an amorphous silicon layer.

According to some embodiments, the method further comprises: removing the sacrificial layer after the planarization process.

According to some embodiments, the through hole is disposed within the recessed region.

According to some embodiments, the horizontal fins are suspended above the source conductive plate.

According to some embodiments, the first conductive layer has a thickness of about 1-15 nm.

According to some embodiments, the first conductive layer comprises tungsten, tungsten silicide, titanium, titanium nitride, N-type doped polysilicon, N-type rugged or hemispherical grain (HSG) polysilicon.

According to some embodiments, the capacitor dielectric layer has a thickness of about 1-10 nm.

According to some embodiments, the capacitor dielectric layer comprises silicon oxide, silicon nitride, silicon oxynitride, hafnium oxide, or arsenic oxide.

According to some embodiments, the second conductive layer comprises tungsten, tungsten silicide, titanium, titanium nitride or N-type doped polysilicon.

Another aspect of the invention provides a stacked capacitor including a substrate having a first ILD layer thereon and at least one source conductive plate in the first ILD layer; a second ILD layer disposed on the first ILD layer; at least one stacked capacitor area disposed in the second ILD layer, wherein the at least one stacked capacitor area partially exposes the at least one source conductive plate; a fin-shaped structure disposed on the at least one source conductive plate within the at least one stacked capacitor area in the second ILD layer, wherein the fin-shaped structure comprises horizontal fins and vertical fins; a widened central hole penetrating through the fin-shaped structure and partially exposing the source conductive plate; a first conductive layer disposed on the fin-shaped structure and the source conductive plate in the widened central hole; a capacitor dielectric layer disposed on the first conductive layer; and a second conductive layer disposed on the capacitor dielectric layer.

According to some embodiments, the horizontal fins are suspended above the source conductive plate within the widened central hole.

According to some embodiments, the vertical fins protrude from a top surface of the second ILD layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorpo

Figure 1:
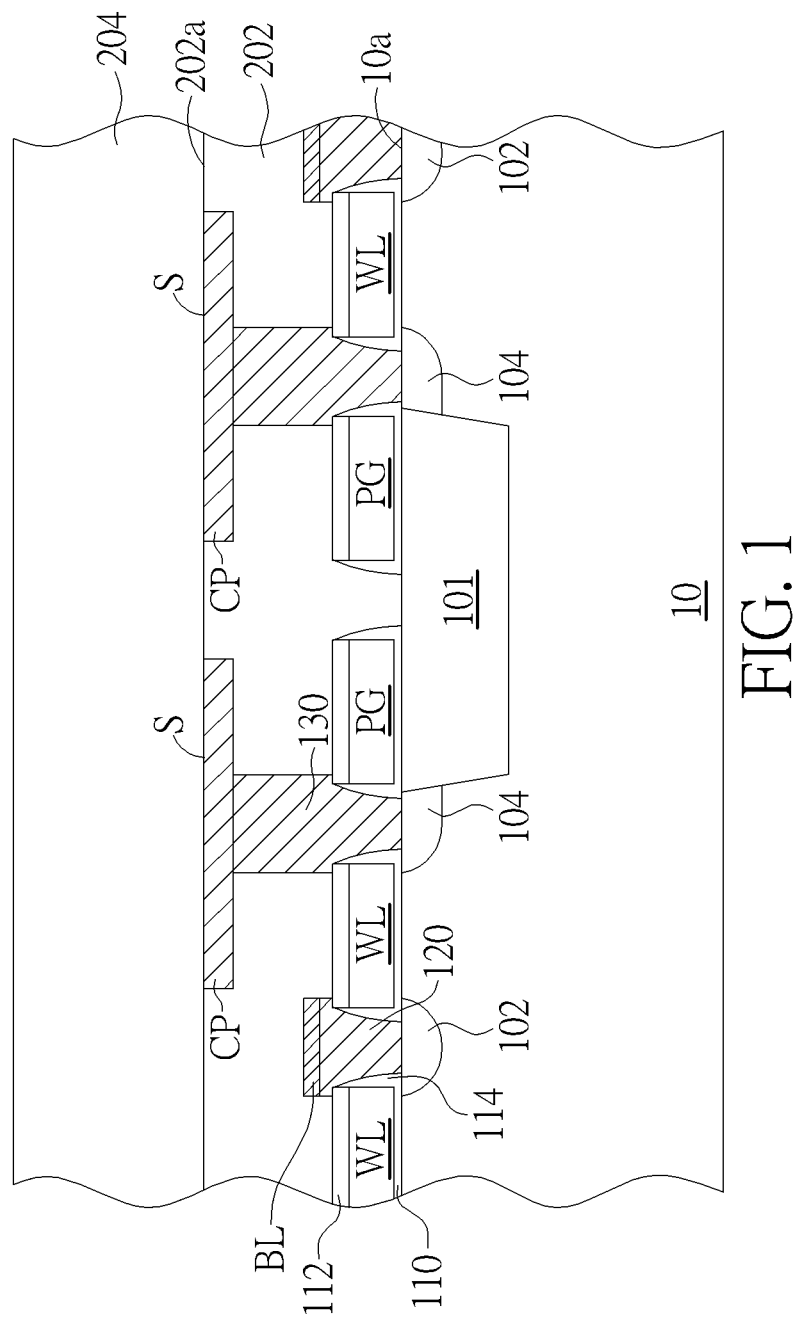
- FIG. 1 to FIG. 8 are cross-sectional diagrams showing a method for fabricating a semiconductor device with a stacked capacitor according to one embodiment of the present disclosure.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

Embodiments are described herein with reference to cross-section illustrations that are schematic illustrations of idealized embodiments (and intermediate structures). Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 to FIG. 8 are cross-sectional diagrams showing a method for fabricating a semiconductor device with a stacked capacitor according to one embodiment of the present disclosure. As shown in FIG. 1, first, a substrate 10 is provided. According to one embodiment, the substrate 10 may comprise a bulk semiconductor substrate such as a P-type doped silicon substrate. In some embodiments, the substrate 10 may comprise a silicon-on-insulator (SOI) substrate. On a main surface 10a of the substrate 10, a plurality of circuit elements may be fabricated. For example, shallow trench isolation (STI) regions 101 may be fabricated in the main surface 10a to isolate active areas from one another. Doped regions 102 and 104 such as N-type doped regions may be formed in the substrate 10, which may function as source or drain regions of transistors. For example, the doped regions 102 may be drain regions and the doped regions 104 may be source regions.

According to one embodiment, word lines WL and passing gates PG may be formed on the main surface 10a of the substrate 10. For example, the word lines WL and passing gates PG may comprise polysilicon, metal or silicide, nanosheet, nano-wire, or the like, but is not limited thereto. According to one embodiment, the passing gates PG may be disposed directly on the STI region 101. According to one embodiment, each of the word lines WL and passing gates PG may comprise a gate dielectric layer 110, a capping layer 112, and a sidewall spacer 114. The word lines WL and the doped regions 102 and 104 may constitute metal-oxide-semiconductor (MOS) transistors on the main surface 10a of the substrate 10. It is to be understood that the MOS transistors may be planar-type and fin-type MOS transistors.

After the formation of the word lines WL, the passing gates PG, and the doped regions 102 and 104, an interlayer dielectric (ILD) layer 202 such as a silicon oxide layer is deposited over the main surface 10a of the substrate 10. The word lines WL and passing gates PG are covered with the ILD layer 202. Bit lines BL are disposed in the ILD layer 202. Each of the bit lines BL is electrically connected to a corresponding doped region 102 via a contact plug 120. According to one embodiment, the contact plug 120 may comprise tungsten, titanium, titanium nitride, tantalum, tantalum nitride, or the like.

According to one embodiment, source conductive plates CP may be formed in the ILD layer 202. Each of the source conductive plates CP is electrically connected to a corresponding doped region 104 via a contact plug 130. According to one embodiment, the source conductive plates CP may be formed in a horizontal level that is higher than that of the bit lines BL. According to one embodiment, a top surface S of the source conductive plate CP may be flush with a top surface 202a of the ILD layer 202. According to one embodiment, the source conductive plates CP may be a damascened copper plate and may be formed by performing a copper damascene process, but not limited thereto. In some embodiments, the source conductive plates CP may comprise tungsten. Subsequently, an interlayer dielectric (ILD) layer 204 such as a silicon oxide layer is deposited over the ILD layer 202 and the source conductive plates CP.

Figure 2:
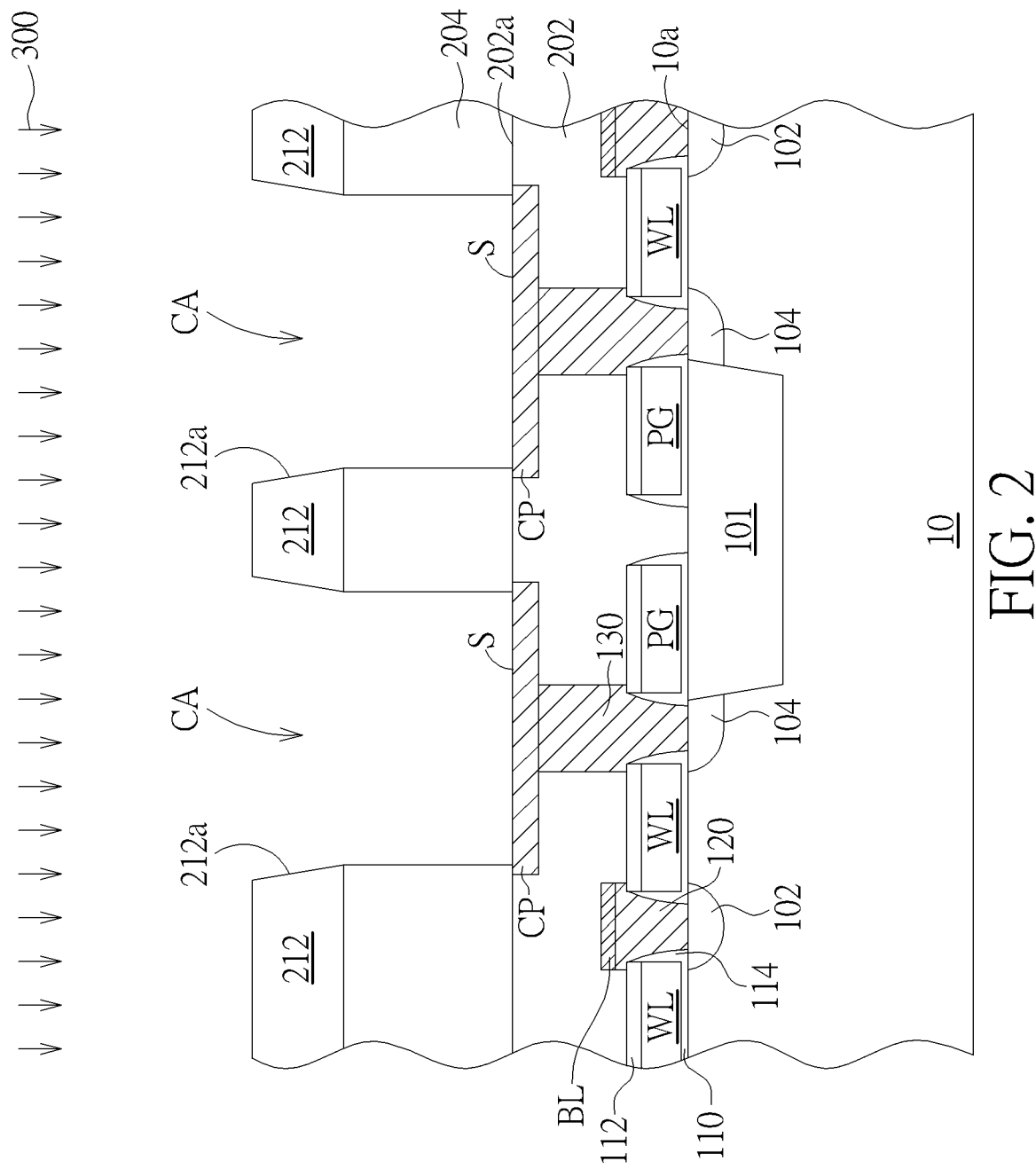

As shown in FIG. 2, a patterned photoresist layer 212 is then formed on the ILD layer 204. The patterned photoresist layer 212 comprises openings 212a that expose portions of the ILD layer 204. The openings 212a define the location and range of the capacitor areas to be formed in later stages. Subsequently, using the patterned photoresist layer 212 as an etching mask, an anisotropic dry etching process 300 may be performed to etch the ILD layer 204 through the openings 212a of the patterned photoresist layer 212, thereby forming stacked capacitor areas CA. According to one embodiment, each of the stacked capacitor areas CA at least partially exposes the top surface S of the source conductive plate CP. The remaining photoresist layer 212 is then stripped off.

Figure 3:
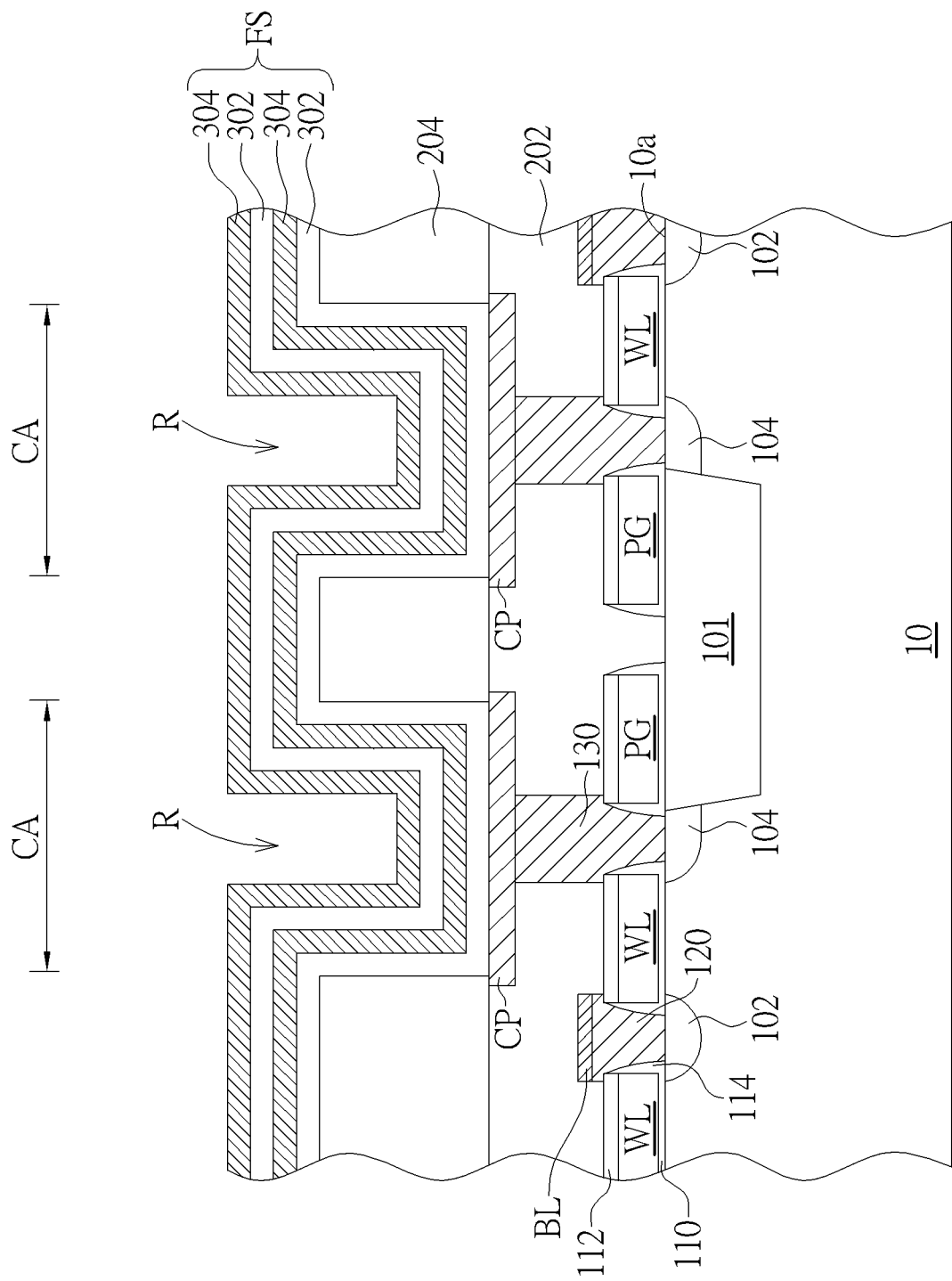

As shown in FIG. 3, a film stack FS of alternating nonconductive dielectric layers, for example, alternating silicon oxide layers 302 and silicon nitride layers 304, are deposited on the ILD layer 204 and the interior surface of the stacked capacitor areas CA. According to one embodiment, for example, a silicon oxide layer 302 of about 2-20 nm thick is conformally deposited over the ILD layer 204 and within the interior surface of the stacked capacitor areas CA. The silicon oxide layer 302 directly covers the top surface S of the source conductive plate CP. Then, a silicon nitride layer 304 of about 2-20 nm thick is conformally deposited on the silicon oxide layer 302. According to one embodiment, the deposition steps of the silicon oxide layer 302 and the silicon nitride layer 304 may be repeated alternately for multiple times so as to form the film stack FS of alternating layers. The silicon oxide layers 302 and silicon nitride layers 304 may be deposited by any suitable methods such as chemical vapor deposition (CVD) methods.

It is to be understood that the number of the alternating layers in the figures is for illustration purposes only. In some embodiments, the film stack FS may comprise tens of or even hundreds of alternating layers, but not limited thereto. According to one embodiment, a recessed region R may be formed on the topmost layer of the film stack FS within each of the stacked capacitor areas CA.

Figure 4:
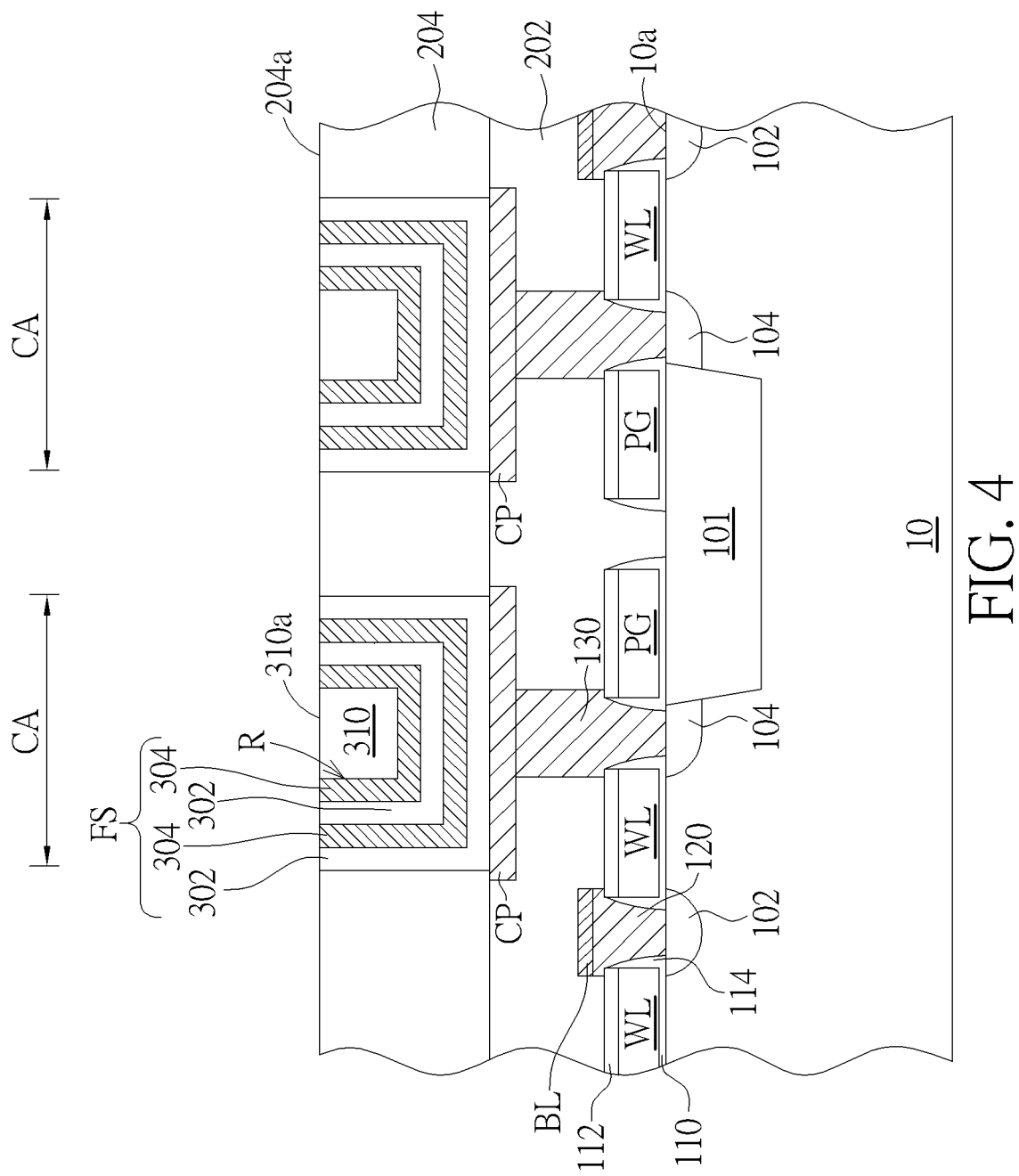

As shown in FIG. 4, a sacrificial layer 310 such as a photoresist, an organic planarization layer (OPL) or an amorphous silicon layer is then deposited over the film stack FS. According to one embodiment, the recessed region R may be completely filled with the sacrificial layer 310. Subsequently, a planarization process such as a chemical mechanical polishing (CMP) process or etch back process is carried out to planarize the film stack FS and the sacrificial layer 310. After the planarization process is completed, the top surface 204a of the ILD layer 204 is exposed, and the top surface 310a of the sacrificial layer 310 is flush with the top surface 204a of the ILD layer 204.

Figure 5:
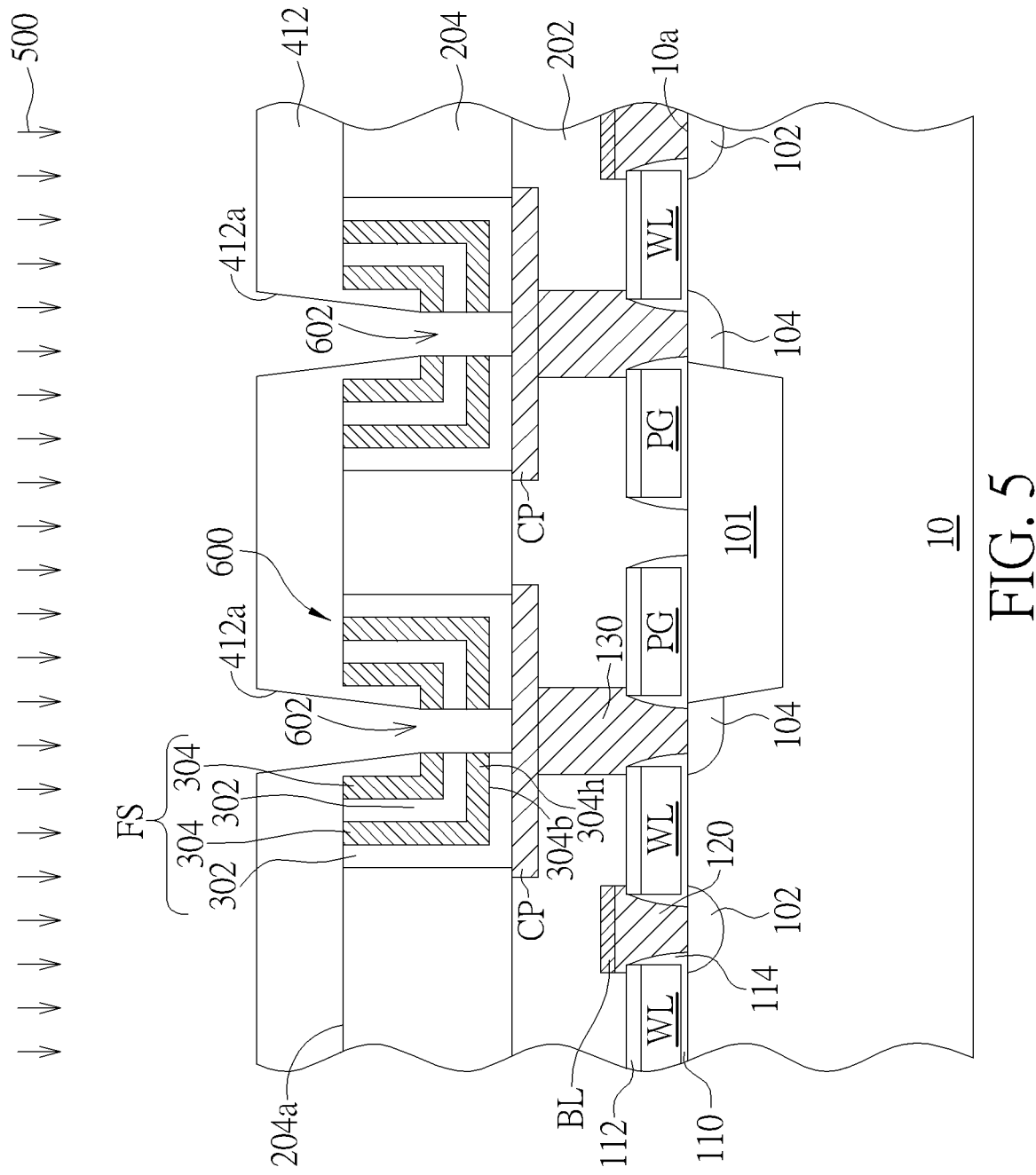

As shown in FIG. 5, subsequently, the sacrificial layer 310 may be removed. According to one embodiment, a patterned photoresist layer 412 is then formed on the ILD layer 204 and the film stack FS to define bottom (or inner) electrode contact areas. The patterned photoresist layer 412 has an opening 412a that is substantially aligned with the recessed region R. Subsequently, using the patterned photoresist layer 412 as an etching mask, an anisotropic dry etching process 500 may be performed to etch the film stack FS through the openings 412a of the patterned photoresist layer 412, thereby forming a through hole 602 in the film stack FS within the recessed region R. The through hole 602 exposes a portion of the source conductive plate CP. The remaining photoresist layer 412 is then stripped off.

Figure 6:
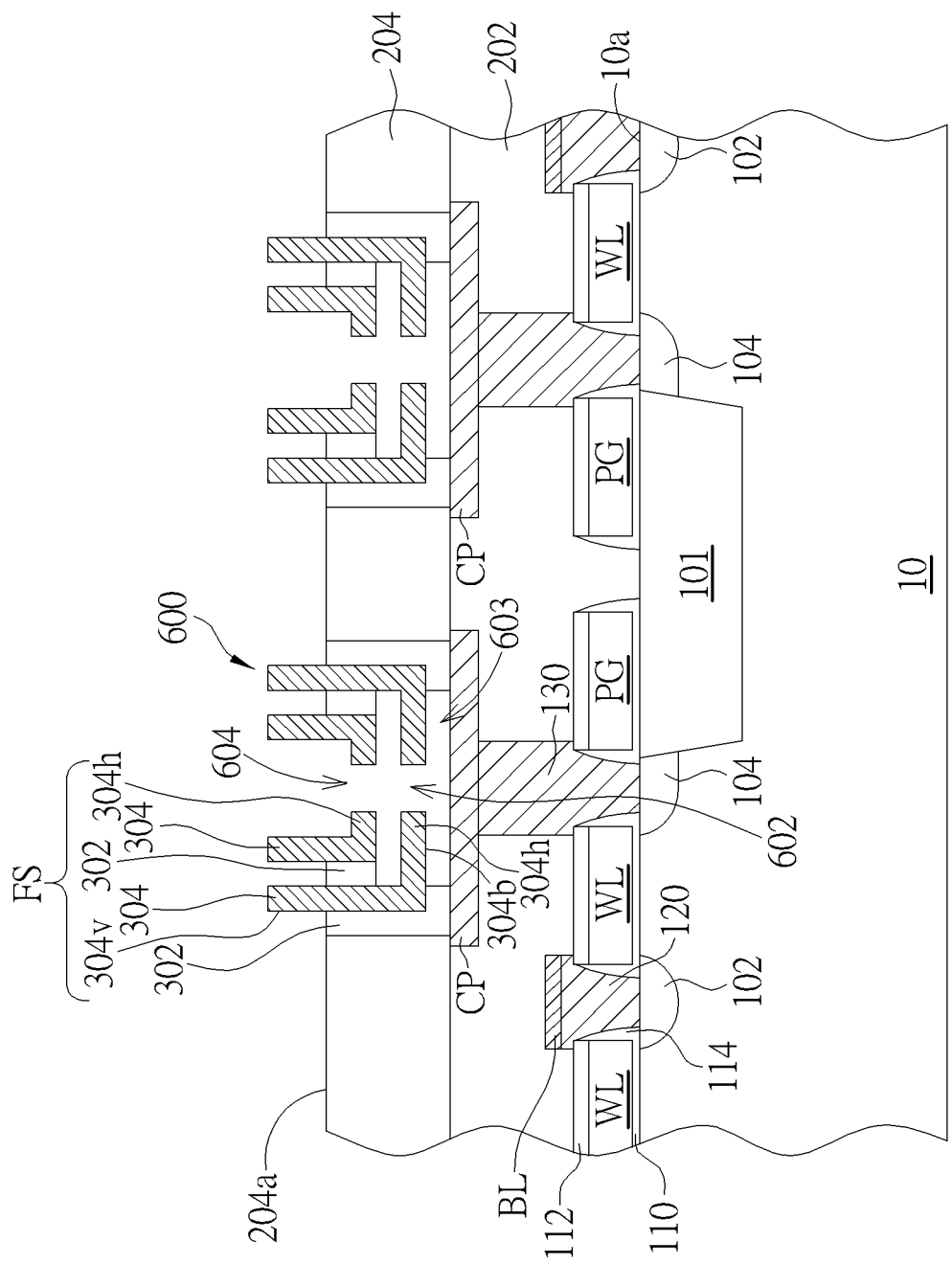

As shown in FIG. 6, an isotropic etching process such as wet chemical etching or chemical dry etching (CDE) is then carried out to selectively etch the silicon oxide layers 302 in the film stack FS via the through hole and the ILD layer 204, thereby forming a widened central hole 604 and a fin-shaped structure 600 in the ILD layer 204. The widened central hole 604 is formed by laterally recess-etching the silicon oxide layers 302 via the through hole 602. Therefore, the widened central hole 604 is composed of the through hole 602 and the lateral recesses 603. According to one embodiment, the fin-shaped structure 600 comprises horizontal fins 304h and vertical fins 304v. According to one embodiment, a bottom surface 304b of the horizontal fin 304h of each silicon nitride layer 304 is at least partially exposed within the widened central hole 604 and the horizontal fins 304h are suspended above the source conductive plate CP. The vertical fin 304v of each silicon nitride layer 304 protrudes from the top surface 204a of the ILD layer 204 due to the recess etching of the ILD layer 204 and silicon oxide layers 302 during the isotropic etching process.

According to one embodiment, the silicon nitride layers 304 are similar to a set of stacked cups of decreasing size physically separated from on another by the remaining silicon oxide layers 302. The remaining silicon oxide layers 302 between the cup-shaped silicon nitride layers 304 function as a support structure that joins the silicon nitride layers 304 together and secures the silicon nitride layers 304 to the ILD layer 204 and the perimeter of the source conductive plate CP. Careful control of the isotropic etching process ensures that the required amount of the silicon oxide layers 302 remains between the cup-shaped silicon nitride layers 304. According to one embodiment, a thickness of the remaining ILD layer 204 may be about 30%-70% of its original thickness.

Figure 7:
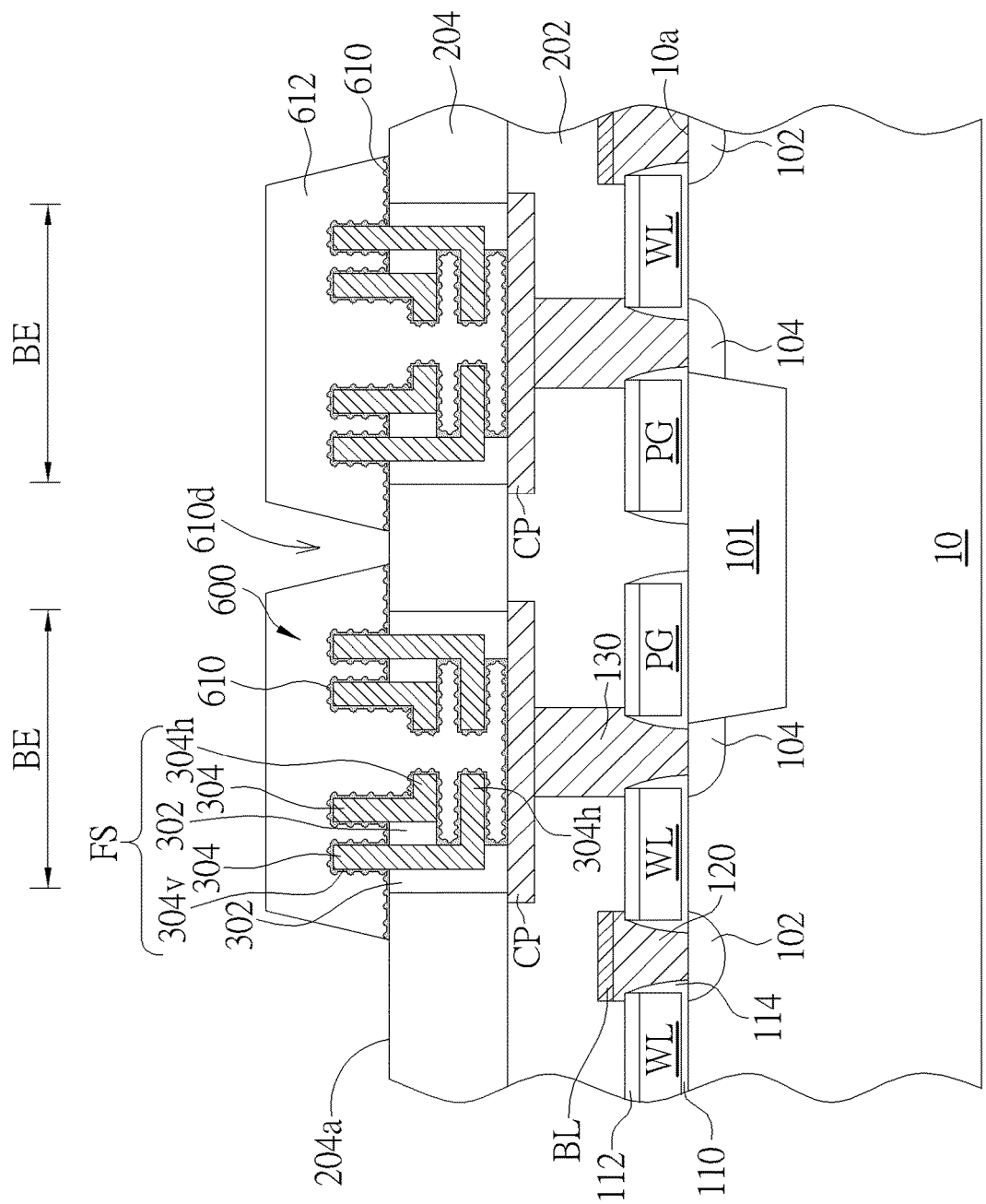

As shown in FIG. 7, a conductive layer 610 is then conformally deposited onto the protruding vertical fin 304v of each silicon nitride layer 304, the horizontal fins 304h suspended above the source conductive plate CP, the exposed end surfaces of the remaining silicon oxide layers 302 between the cup-shaped silicon nitride layers 304, and on the top surface 204a of the ILD layer 204. According to one embodiment, the conductive layer 610 may have a thickness of about 1-15 nm, but not limited thereto. According to one embodiment, the conductive layer 610 may comprise tungsten, tungsten silicide, titanium, titanium nitride, N-type doped polysilicon, N-type rugged or hemispherical grain (HSG) polysilicon, or the like, preferably, N-type rugged or HSG polysilicon.

According to one embodiment, the conductive layer 610 functions as a bottom electrode of a capacitor. Subsequently, a patterned photoresist layer 612 is formed on the ILD layer 204 and the fin-shaped structure 600. The patterned photoresist layer 612 masks the fin-shaped structure 600 and defines the bottom electrode areas BE. The conductive layer 610 that is not covered by the patterned photoresist layer 612 is then etched away to thereby form a discontinuity 610d between two adjacent bottom electrode areas BE. Subsequently, the remaining photoresist layer 612 is stripped off.

Figure 8:
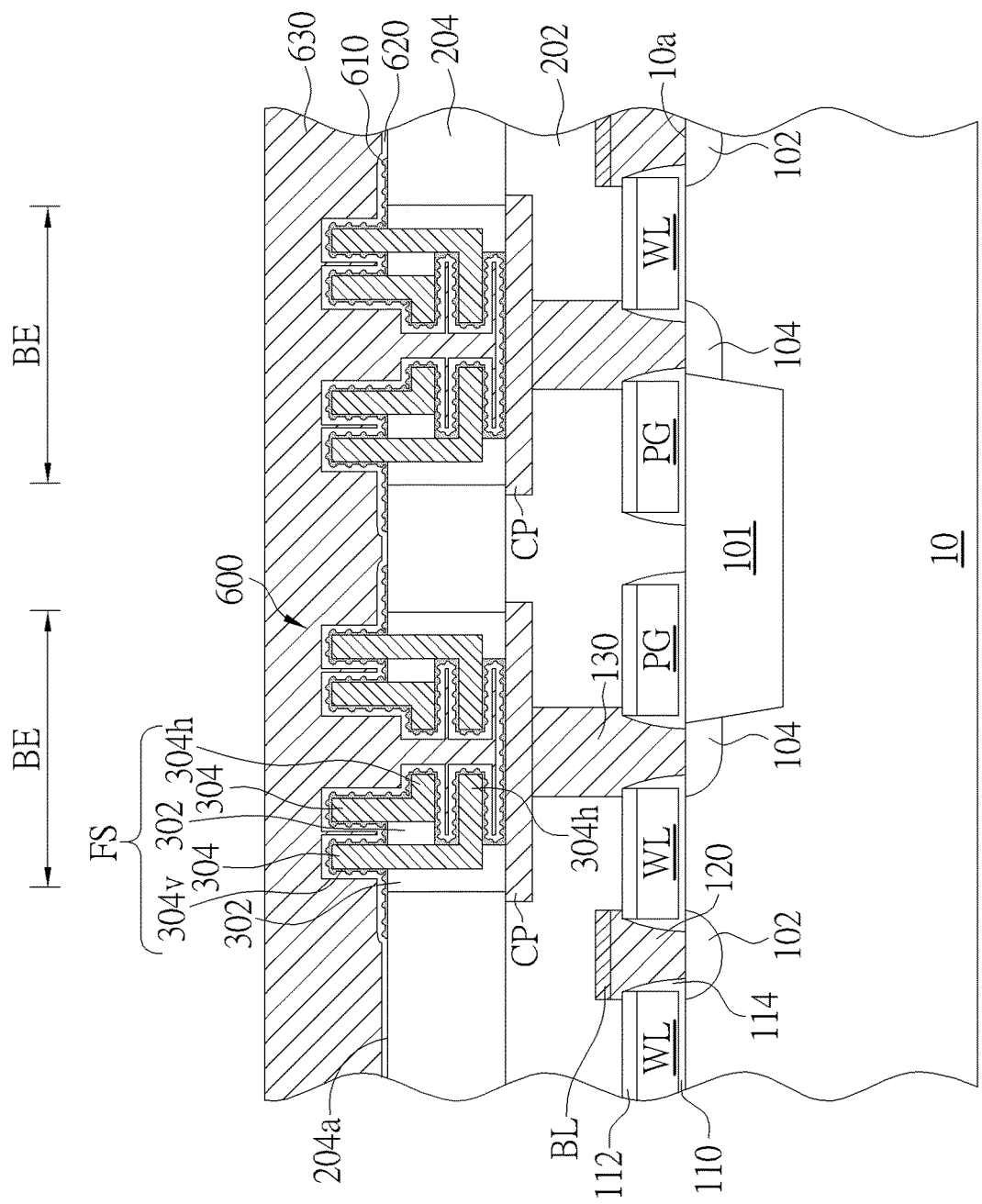

As shown in FIG. 8, a capacitor dielectric layer 620 is then conformally deposited on the conductive layer 610 within the bottom electrode areas BE and on the top surface 204a of the ILD layer 204. According to one embodiment, the capacitor dielectric layer 620 may comprise silicon oxide, silicon nitride, silicon oxynitride, hafnium oxide, arsenic oxide, or the like, or any combinations thereof. According to one embodiment, the capacitor dielectric layer 620 may have a thickness of about 1-10 nm. After the formation of the capacitor dielectric layer 620, a conductive layer 630 is deposited on the capacitor dielectric layer 620 in a blanket manner. According to one embodiment, the conductive layer 630 may comprise tungsten, tungsten silicide, titanium, titanium nitride, N-type doped polysilicon, or the like, or any combinations thereof. The conductive layer 630 functions as a top electrode or a common plate. The widened central hole 604 may be completely filled with the capacitor dielectric layer 620 and the conductive layer 630. Optionally, a CMP process may be performed to planarize the conductive layer 630.

It is advantageous to use the present invention because the fin-shaped structure 600 can help to significantly increase the capacitance of the stacked capacitors. Further, the fabrication process for forming the fin-shaped structure 600 does not involve expensive etching and deposition tools, but only involves inexpensive wet oxide etching process that is performed with inexpensive wet chemicals.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a stacked capacitor, comprising:
   providing a substrate having a first interlayer dielectric (ILD) layer thereon and at least one source conductive plate in the first ILD layer;
   depositing a second ILD layer on the first ILD layer;
   forming at least one stacked capacitor area in the second ILD layer;
   forming a film stack comprising alternating first layers and second layers on the second ILD layer and an interior surface of the stacked capacitor area, wherein the film stack comprises a recessed region within the stacked capacitor area;
   performing a planarization process to remove the film stack such that a top surface of the second ILD layer is exposed, wherein each surface of the film stack on an interior surface of the stacked capacitor area is flush with the top surface of the second ILD layer;
   forming a through hole in the film stack, wherein the through hole partially exposes the source conductive plate;
   performing an isotropic etching process to selectively etch the first layers of the film stack via the through hole and the second ILD layer, thereby forming a widened central hole and a fin-shaped structure in the second ILD layer, wherein the fin-shaped structure comprises horizontal fins and vertical fins;
   forming a first conductive layer on the fin-shaped structure;
   forming a capacitor dielectric layer on the first conductive layer; and
   forming a second conductive layer on the capacitor dielectric layer.

2. The method according to claim 1, wherein the stacked capacitor area at least partially exposes a top surface of the source conductive plate.

3. The method according to claim 1, wherein the first layers and second layers are nonconductive dielectric layers.

4. The method according to claim 1, wherein the first layers comprise silicon oxide layers and the second layers comprise silicon nitride layers.

5. The method according to claim 4, wherein each of the silicon oxide layers has a thickness of about 2-20 nm.

6. The method according to claim 4, wherein each of the silicon nitride layers has a thickness of about 2-20 nm.

7. The method according to claim 1 further comprising:
   forming a sacrificial layer over the film stack to fill the recessed region.

8. The method according to claim 7, wherein sacrificial layer comprises a photoresist, an organic planarization layer or an amorphous silicon layer.

9. The method according to claim 7 further comprising:
   removing the sacrificial layer after the planarization process.

10. The method according to claim 1, wherein the through hole is disposed within the recessed region.

11. The method according to claim 1, wherein the horizontal fins are suspended above the source conductive plate.

12. The method according to claim 1, wherein the first conductive layer has a thickness of about 1-15 nm.

13. The method according to claim 1, wherein the first conductive layer comprises tungsten, tungsten silicide, titanium, titanium nitride, N-type doped polysilicon, N-type rugged or hemispherical grain (HSG) polysilicon.

14. The method according to claim 1, wherein the capacitor dielectric layer has a thickness of about 1-10 nm.

15. The method according to claim 1, wherein the capacitor dielectric layer comprises silicon oxide, silicon nitride, silicon oxynitride, hafnium oxide, or arsenic oxide.

16. The method according to claim 1, wherein the second conductive layer comprises tungsten, tungsten silicide, titanium, titanium nitride or N-type doped polysilicon.

17. A stacked capacitor, comprising:
   a substrate having a first interlayer dielectric (ILD) layer thereon and at least one source conductive plate in the first ILD layer;
   a second ILD layer disposed on the first ILD layer;
   at least one stacked capacitor area disposed in the second ILD layer, wherein the at least one stacked capacitor area partially exposes the at least one source conductive plate;
   a fin-shaped structure disposed on the at least one source conductive plate within the at least one stacked capacitor area in the second ILD layer, wherein the fin-shaped structure comprises horizontal fins and vertical fins, wherein the fin-shaped structure further comprises a pit-like recess;
   a widened central hole penetrating through the fin-shaped structure and partially exposing the source conductive plate;
   a first conductive layer disposed on the fin-shaped structure and the source conductive plate in the widened central hole;
   a capacitor dielectric layer disposed on the first conductive layer; and
   a second conductive layer disposed on the capacitor dielectric layer.

18. The stacked capacitor according to claim 17, wherein the horizontal fins are suspended above the source conductive plate within the widened central hole.

19. The stacked capacitor according to claim 17, wherein the vertical fins protrude from a top surface of the second ILD layer.

* * * * *